US 6,630,366 B2

(12) United States Patent
Taniguchi et al.

(10) Patent No.: US 6,630,366 B2
(45) Date of Patent: Oct. 7, 2003

(54) MANUFACTURING METHOD FOR LIGHT EMITTING DEVICE

(75) Inventors: Takehiro Taniguchi, Tokyo (JP); Hironobu Narui, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/909,254

(22) Filed: Jul. 19, 2001

(65) Prior Publication Data

US 2002/0005523 A1 Jan. 17, 2002

Related U.S. Application Data

(62) Division of application No. 09/515,917, filed on Mar. 1, 2000, now Pat. No. 6,444,998.

(30) Foreign Application Priority Data

Mar. 18, 1999 (JP) ............................................. P11-073918

(51) Int. Cl.[7] .............................................. H01L 21/00
(52) U.S. Cl. ............................. 438/34; 438/22; 438/28; 438/42
(58) Field of Search .......................... 438/28, 341, 421, 438/22

(56) References Cited

U.S. PATENT DOCUMENTS

| | | | | |
|---|---|---|---|---|
| 4,603,470 A | * | 8/1986 | Yamazaki | |
| 5,262,658 A | * | 11/1993 | Jankowski | ................... 257/88 |
| 5,332,450 A | * | 7/1994 | Yamazaki | |
| 5,362,673 A | * | 11/1994 | Iechi | |
| 5,633,514 A | * | 5/1997 | Shiraishi et al. | .............. 257/94 |
| 5,972,729 A | * | 10/1999 | Shimizu et al. | |

FOREIGN PATENT DOCUMENTS

| | | | |
|---|---|---|---|
| JP | 354056796 | * | 5/1979 |
| JP | 0380106 A2 | * | 1/1990 |
| JP | 0380106 | | 8/1990 |
| JP | 406275782 | | 9/1994 |
| JP | 406275782 A | * | 9/1994 |
| JP | 407058310 A | * | 3/1995 |
| JP | 407193277 | * | 7/1995 |
| JP | 410070336 | * | 3/1998 |
| JP | 407058310 | | 2/1999 |
| JP | 2000269601 | | 9/2000 |
| JP | 02000269601 A | * | 9/2000 |

* cited by examiner

*Primary Examiner*—Long Pham
(74) *Attorney, Agent, or Firm*—Sonnenschein, Nath & Rosenthal LLP

(57) ABSTRACT

In semiconductor light emitting sections capable of effectively improving electric cross-talk and effectively avoiding short-circuit between each of light emitting devices, in which a plurality of semiconductor light emitting sections are formed to a semiconductor substrate, and at least one of electrodes for the semiconductor light emitting sections and bonding pads lead out electrically from the electrodes and connected with external leads are formed on one main surface of a semiconductor substrate, a high resistance isolation region is formed, facing the main surface of the semiconductor substrate, below a portion between adjacent conductor layers for electrical leading from the electrode to the bonding pad.

8 Claims, 15 Drawing Sheets

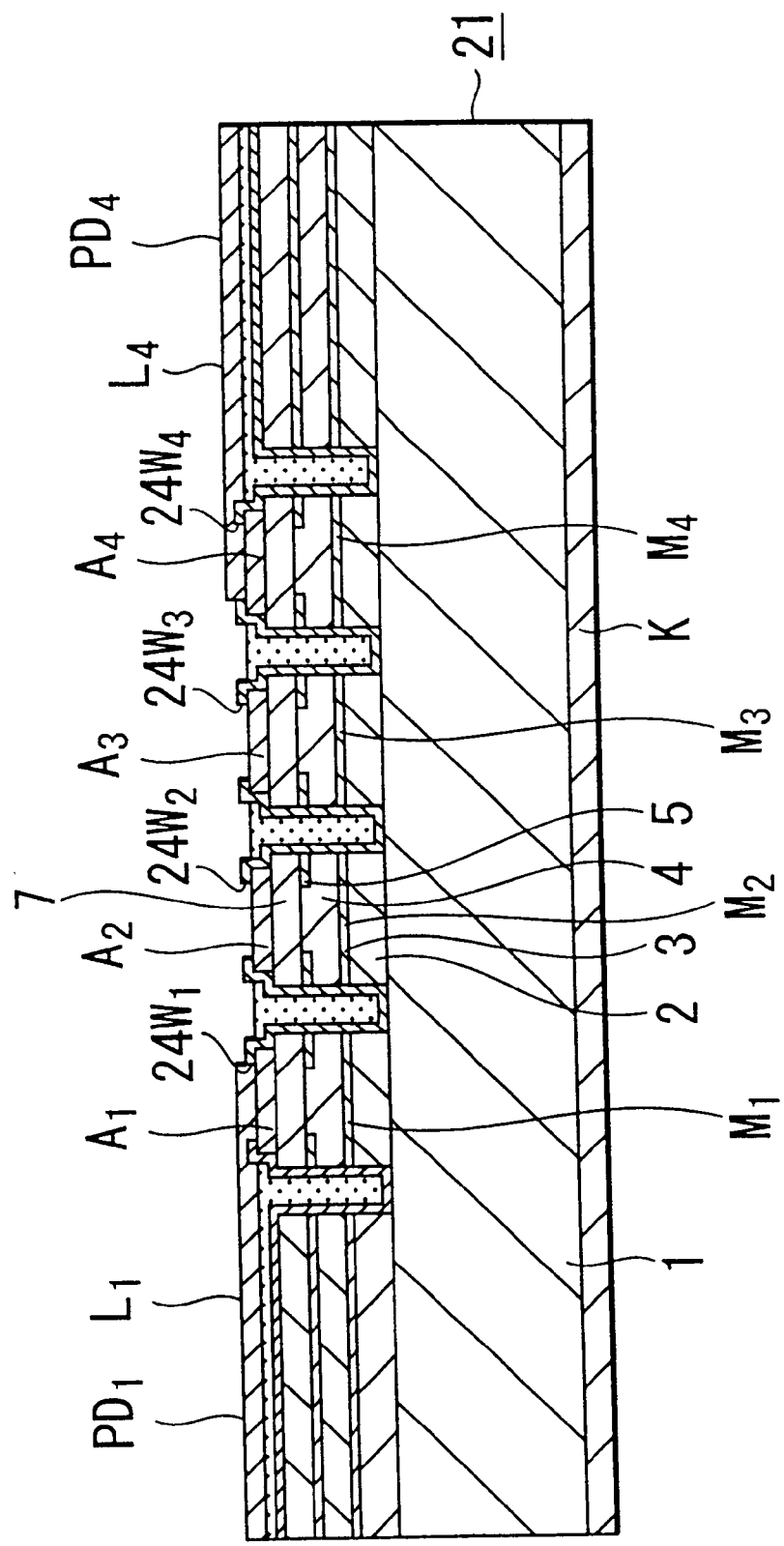

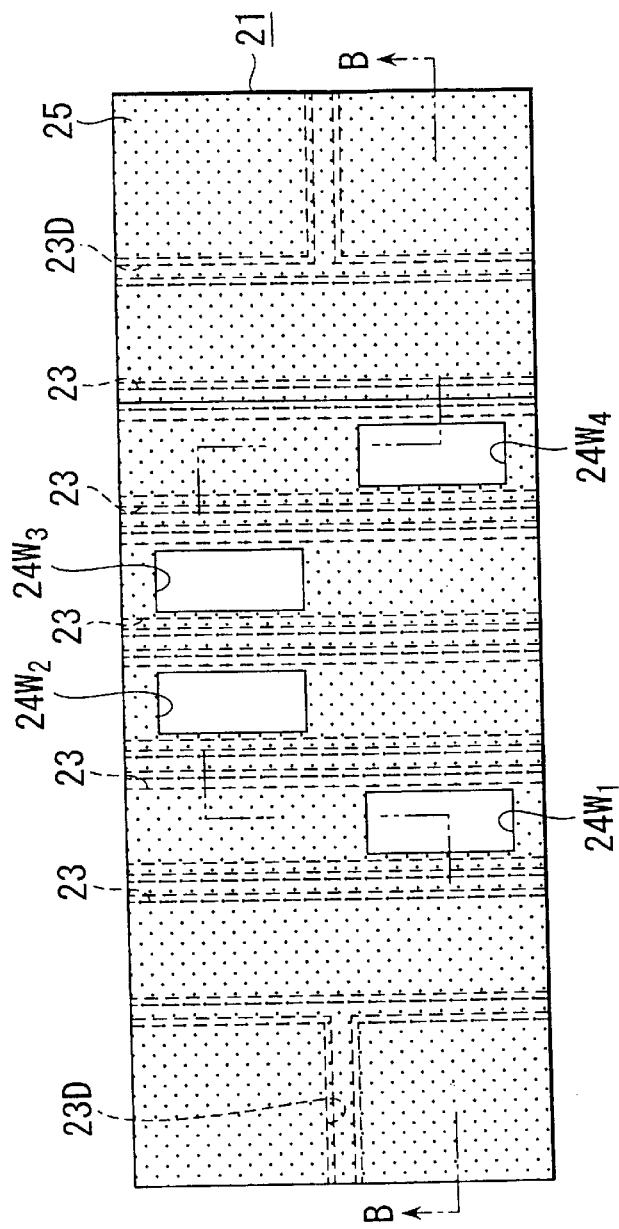
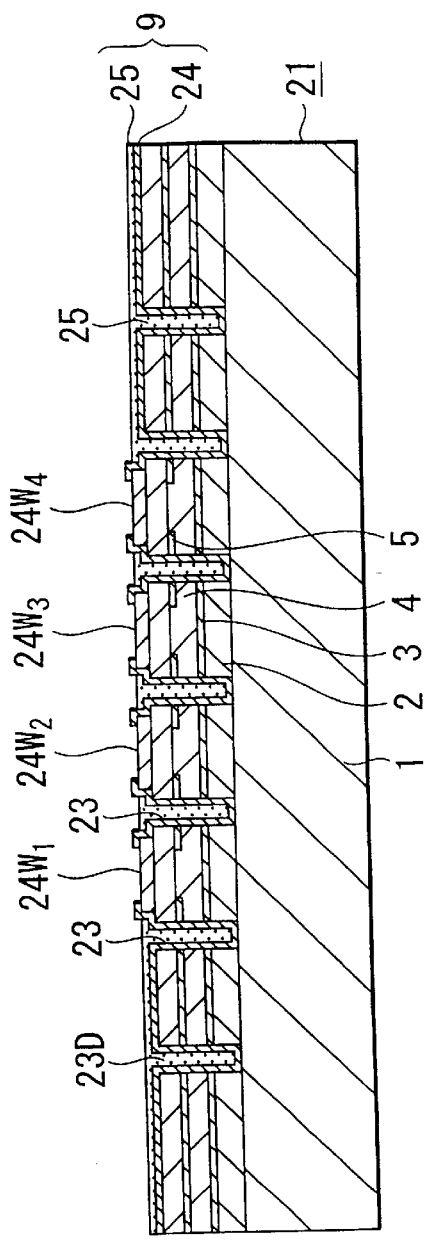
FIG. 8A
FIG. 8B

MANUFACTURING METHOD FOR LIGHT EMITTING DEVICE

RELATED APPLICATION DATA

This application is a divisional of application Ser. No. 09/515,917 filed Mar. 1, 2000, now U.S. Pat. No. 6,444,998.

The present and foregoing application claims priority to Japanese Application No. P11-073918 filed Mar. 18, 1999. All of the foregoing applications are incorporated herein by reference to the extent permitted by law.

BACKGROUND OF THE INVENTION

1. Field of the Invention

The present invention concerns a semiconductor light emitting device suitable to application, for example, to a multi-beam semiconductor laser device or a multi-beam semiconductor diode device, as well as a manufacturing method thereof.

2. Description of Related Art

A semiconductor light emitting device such as a semiconductor laser or a semiconductor light emitting diode has been used, for example, as an optical device for conducting recording and/or reproduction to an optical recording medium such as an optical disc, or as a light source for a laser beam printer or the like. In recent years, a demand for a multi-beam arrangement has been increased more and more for driving a plurality of light emitting sections independently of each other, for enabling recording and/or reproduction or printing at a higher speed by using such semiconductor light emitting devices.

On the other hand, for attaining cost reduction and attaining increased speed, it is necessary to reduce the size of an optical system to the multi-beam semiconductor light emitting device and, correspondingly, a demand has been increased for higher degree of integration so as to narrow the beam pitch as much as possible.

In a semiconductor light emitting device, for example, a semiconductor multi-beam laser for enabling independent driving and intended for higher integration degree, as shown in a schematic perspective view of FIG. 9, a plurality of semiconductor light emitting sections, namely, four semiconductor laser devices $M_1$ to $M_4$ in the illustrated example are arranged side by side such that they can be driven independently to a semiconductor substrate 21 at least comprising a first clad layer 2, an active layer 3, and a second clad layer 4 on a semiconductor substrate body 1.

A method of manufacturing the semiconductor light emitting device is to be explained with reference to schematic cross sectional views for each of steps in FIG. 10 to FIG. 13 and a schematic plan view for a portion of steps shown in FIG. 15 and FIG. 16.

At first, as shown in FIG. 10A, on a semiconductor substrate 1, for example, made of an n-type GaAs, there are epitaxially grown a first clad layer 2 made of an n-type AlGaAs, an active layer 3 made, for example, of an intrinsic AlGaAs and having a smaller band gap compared with the clad layer 2 and a second clad layer 4 made of p-type AlGaAs successively.

As shown in FIG. 10C and FIG. 14, and with hatched lines in FIG. 14, current block layers 5 are formed being arranged in parallel in a stripe pattern to the second clad layer 4.

The current block layers 5 are formed on the area between portions for forming the semiconductor light emitting sections $M_1$ to $M_5$ described above and the area corresponding to the outer side of both of outer $M_1$ and $M_4$ by etching grooves 6 in a stripe pattern respectively as shown in FIG. 10B.

Subsequently, an n-type GaAs semiconductor layer of a conduction type different from the second clad layer 4 is epitaxially grown entirely so as to bury the inside of the grooves 6 although not illustrated and etched entirely from the surface thereof to form current block layers 5 formed by leaving the n-type GaAs semiconductor layer only in the grooves as shown in FIG. 10C and FIG. 14.

As shown in FIG. 12A, a cap layer 7 made of a p-type GaAs of a conduction type identical with that of the second clad layer is epitaxially grown entirely covering the current block layers 5 to constitute a semiconductor substrate 21.

As shown in FIG. 11B, electrodes isolated from each other, four electrodes in the illustrated example, first to fourth electrodes $A_1$ to $A_4$ are deposited in ohmic contact as anode electrodes in this example on the cap layer 7 between each of adjacent current block layers 5. In this case, the electrodes $A_1$ and $A_4$ on both sides, a portion thereof is extended to the outside in an L-shaped pattern.

As shown in FIG. 11C and FIG. 15, an isolation groove 8 is formed between each of the electrodes $A_1$ to $A_4$ (indicated by hatched lines in FIG. 15) from the cap layer 7 to a thickness at least traversing the active layer 3.

As shown in FIG. 12A, an interlayer insulation layer 9 is formed over the entire surface by a CVD (Chemical Vapor Deposition) method.

As shown in FIG. 12B, first to fourth openings $9W_1$ to $9W_4$ are perforated on the electrodes $A_1$ to $A_4$, respectively, to the interlayer insulation layer 9 (only the first and fourth openings $9W_1$ and $9W_4$ are disclosed in the cross section of FIG. 12B).

As shown in FIG. 12C, a flattening insulation material 10 is coated over the entire surface so as to bury the inside of each of the isolation grooves 8.

Subsequently, as shown in FIG. 13 and FIG. 16, the first to fourth openings $9W_1-9W_2$ are opened again to the flattening insulation material 10 from the surface thereof and are etched back in a plane manner to the position that the first to fourth electrodes $A_1$ to $A_2$ are exposed to the outside through the openings $9W_1 -9W_4$.

Then, as shown in FIG. 9, conductor layers $L_2$ and $L_3$ in ohmic contact with the second and third electrodes $A_2$ and $A_3$ respectively through the second and the third openings $9W_2$ and $9W_3$ are extended and formed overriding the interlayer insulation layers 9, bonding pads $PD_2$ and $PD_3$ are constituted at second and third extended ends of the conductor layers $L_2$ and $L_3$, and first and fourth bonding pads $PD_1$ and $PD_4$ are constituted with the electrodes $A_1$ and $A_4$ exposed through the first and fourth openings $9W_1$ and $9W_4$.

Although not illustrated, external leads, for example, Au wires are bonded to the bonding pads $PD_1$ to $PD_4$ respectively.

Further, a common counter electrode K, namely, a cathode electrode in the example described above is deposited, for example, in an ohmic contact entirely on the rear face of the semiconductor substrate body 1.

In this constitution, when driving voltage is applied between each of the anode electrodes $A_1$ to $A_4$ and the common cathode electrode K independently, current is supplied restrictively in the stripe portions between the electrodes $A_1$ to $A_4$ and the electrode K sandwiched by the current block layers 5 and current is injected restrictively in the active layer 3 below the stripe.

Opposing end faces $21m_1$ and $21m_2$ of the semiconductor substrate 21 constituting both ends of the stripe are formed into a mirror face being constituted, for example, cleavage surface and stripe-like light resonators are constituted in the current injection region between the end faces $21m_1$ and $21m_2$ respectively and laser beams are emitted from both end faces. That is, first to fourth semiconductor light emitting sections $M_1$ to $M_4$ are constituted in respective portions of the stripes.

Since the laser devices, that is, the semiconductor light emitting sections $M_1$ to $M_4$ are isolated from each other by the isolation grooves 8 and the anode electrodes $A_1$ to $A_4$ are constituted electrically independent of each other, they can be driven independently.

However, as the integration degree is increased in the semiconductor multi-beam laser with the constitution described above, since the distance between each of the laser devices, namely, each of the semiconductor light emitting sections $M_1$ to $M_4$ is narrowed, electric cross-talk occurs, actually, between the laser devices, for example, in a case where one of light emitting sections of adjacent laser devices is driven to oscillate continuously, while the other is put to intermittent driving, such that large spike noises occur at the output on the side of the laser device driven to oscillate continuously.

In the structure, for example, described above, cross-talk is caused greatly by parasitic capacitance formed between portions where the first electrode $A_1$ and the fourth electrode $A_4$, and the conductor layers $L_2$ and $L_3$ are laminated by way of the interlayer insulation layer 9 and, actually, between opposing ends of the conductor layers $L_1$ and $L_2$, and between $L_4$ and $L_3$, since they are disposed close to each other.

As a method of reducing the parasitic capacitance, it has been devised to increase the thickness of the interlay insulation layer 9 or decrease the area of the electrode or the conductor layer laminated on the interlayer insulation layer 9.

For instance, it has been proposed a structure, as shown in the schematic perspective view of FIG. 17, that the first and fourth electrodes $A_1$ and $A_4$ are also arranged in parallel into stripe patterns like the second and third electrodes $A_3$ and $A_2$, openings $9W_1$ to $9W_4$ are apertured respectively to the interlayer insulation layer 9 on each of the electrodes $A_1$ to $A_4$, first to fourth conductor layers $L_1$ to $L_4$ formed into a narrow width to be in contact therewith are extended on the interlayer insulation layer 9, and bonding pads $PD_1$ to $PD_4$ for connection with external leads respectively at the ends thereof are arranged.

However, also in such a constitution, the cross-talk described above could not be improved effectively. This also depends on that the active layer 3 extends with a large area on both outsides for the light emitting sections $M_1$ and $M_2$ on both sides, so that the parasitic capacitance due to the junction capacitance is rather increased.

In FIG. 17, portions corresponding to those in FIG. 9 carry identical reference numerals, for which duplicate explanations is omitted.

Further, in each of the constitutions described above, when an accident that interlayer insulation layer is destroyed upon bonding an external lead to the bonding pad by the pressing force, an accident of short-circuiting the light emitting devices tends to occur.

SUMMARY OF THE INVENTION

An object of the present invention is to effectively improve the electrical cross-talk and effectively avoid short-circuit between the light emitting devices.

A semiconductor light emitting device according to the present invention has a constitution in which a plurality of semiconductor light emitting sections are formed side by side on a semiconductor substrate, at least one electrode of the semiconductor light emitting sections and a conductor layer led out electrically from each of the electrodes are formed on one main surface of the semiconductor substrate and the conductor layer is formed overriding the interlayer insulation layer on the semiconductor substrate.

Then, a high resistance isolation region is formed, facing the main surface of the semiconductor substrate, between the semiconductor light emitting sections arranged side by side and on each of the outsides of the light emitting sections disposed on both outsides.

Further, in the present invention, a high resistance isolation region for partitioning a portion for forming a bonding pad formed to the conductor layer from other portions can be formed on each of the outsides of the semiconductor light emitting sections disposed on both outsides.

A method of manufacturing a semiconductor light emitting device according to the present invention comprises a step of forming a semiconductor substrate on which a plurality of semiconductor light emitting sections are formed side by side, a step of forming one of electrodes to the semiconductor light emitting sections on one main surface of the semiconductor substrate, a step of forming a conductor layer electrically led out of the electrode on one main surface of the semiconductor substrate and a step of forming, to the semiconductor substrate, a high resistance isolation region, facing the main surface of the semiconductor substrate, between portions for forming each of the semiconductor light emitting sections and to both outsides of the portions for forming the semiconductor light emitting sections.

In the semiconductor light emitting device according to the constitution of the present invention as described above, since the high resistance isolation region is disposed for all of the plurality of semiconductor light emitting sections, not only between each of the semiconductor light emitting sections but also to the outsides of the semiconductor light emitting sections disposed on both outsides, it is possible to electrically isolate the semiconductor light emitting sections respectively from others, and the parasitic capacitance formed not only between each of the semiconductor light emitting sections but also between the semiconductor light emitting sections disposed on both outsides and the conductor layer of other semiconductor light emitting sections can be reduced and by making the dielectric constant lower, and the cross-talk occurring between the semiconductor light emitting sections caused by the parasitic capacitance can be reduced.

Further, since the extended portions of the active layer present on both outsides are isolated from the semiconductor light emitting sections present on both outsides, the parasitic capacitance due to the junction capacitance in the semiconductor light emitting sections can also be eliminated.

Furthermore, as described above, even when the interlayer insulation layer is broken, for example, upon bonding external bonding pads, short-circuits accident between each of the semiconductor light emitting sections can be avoided by separating the bonding pads of the conductor layer disposed in adjacent with each other by the high resistance isolation region from each other.

Further, in the method of manufacturing the semiconductor light emitting device according to the present invention, the high resistance isolation region is formed also to the outside of the semiconductor light emitting section situated on both outsides of a plurality of semiconductor light emitting sections and, since the high resistance isolation region can be formed simultaneously with the isolation regions for isolating the adjacent light emitting sections from each other, increase in the number of manufacturing steps can be avoided.

In this text, the semiconductor substrate designates not only the substrate constituted entirely with a semiconductor but also includes a substrate in which a semiconductor layer is formed on an insulative or semi-insulative substrate.

BRIEF DESCRIPTION OF THE DRAWINGS

FIG. 4 is a schematic cross sectional view taken along line IV—IV in FIG. 1;

FIG. 8A and FIG. 8B are a schematic plan view in one manufacturing step of one embodiment for a semiconductor light emitting device according to the present invention and a schematic cross sectional view taken along line B—B thereof;

DETAILED DESCRIPTION OF THE PREFERRED EMBODIMENTS

Semiconductor Light Emitting Device

Figure 1:
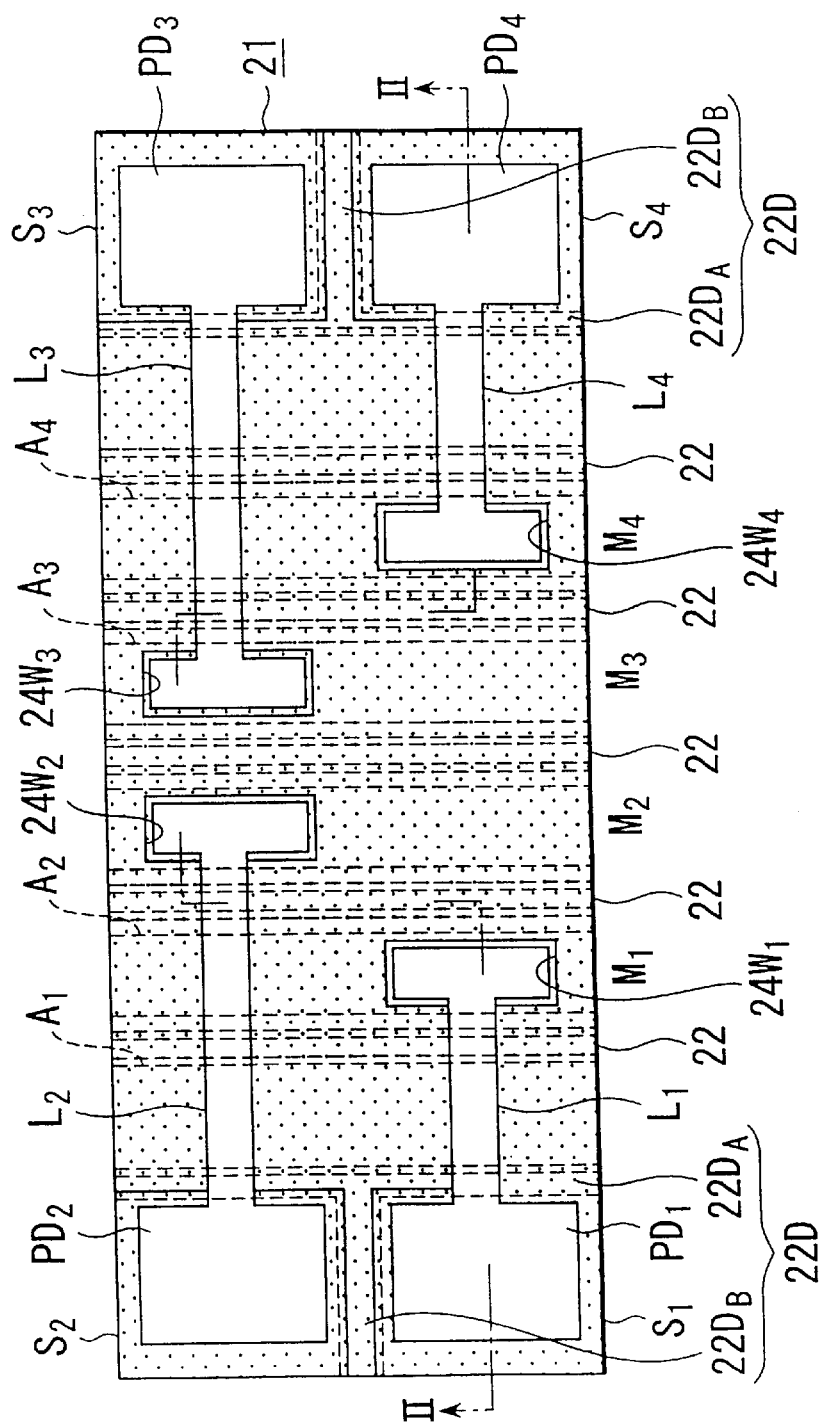
FIG. 1 is a schematic plan view of one embodiment for a semiconductor light emitting device according to the present invention.
Figure 2:
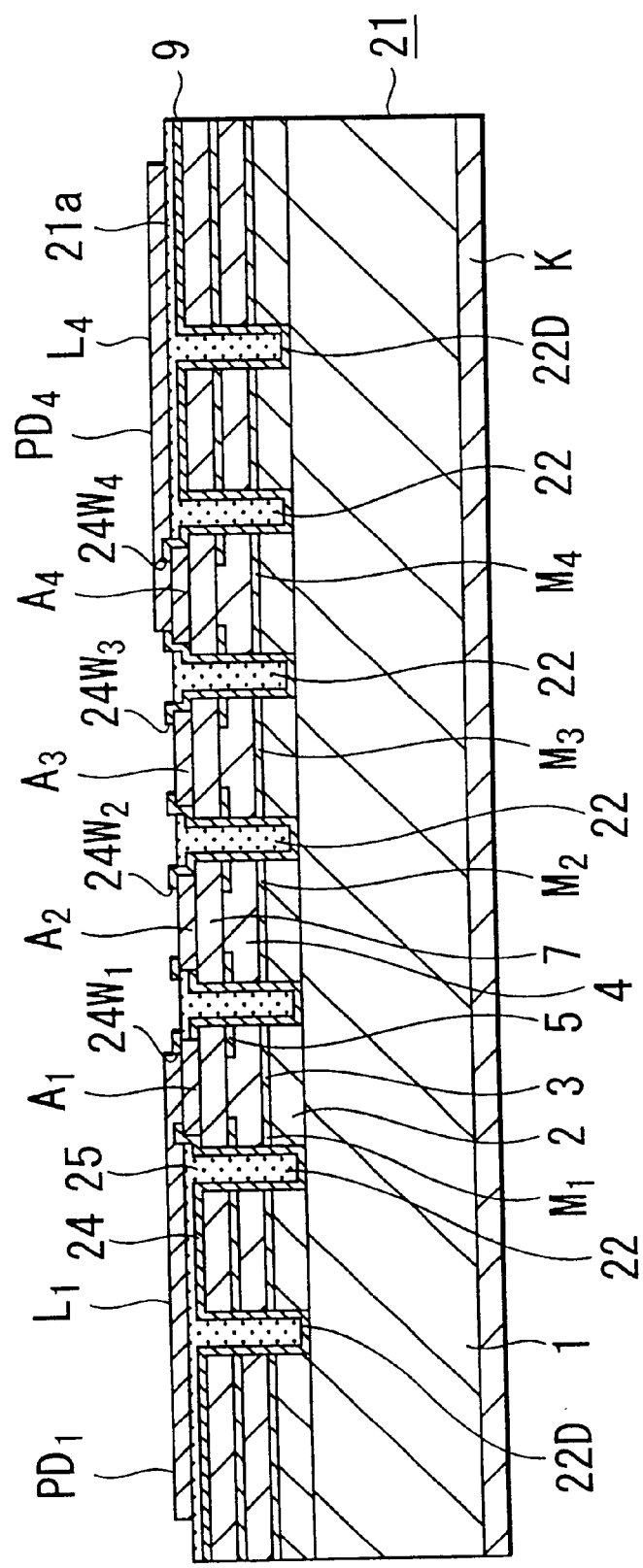
FIG. 2 is a schematic cross sectional view taken along line II—II in FIG. 1.

An example of a preferred embodiment of a semiconductor light emitting device according to the present invention is to be explained with reference to a schematic plan view of FIG. 1 and FIG. 2 illustrating a schematic cross sectional view taken on line II—II in FIG. 1.

In the semiconductor light emitting device according to the present invention, a plurality of semiconductor light emitting sections, namely, four first to fourth semiconductor light emitting sections $M_1$ to $M_4$ in the illustrated embodiment are formed side by side on a semiconductor substrate 21, and first to fourth electrodes $A_1$ to $A_4$ for at least one of the semiconductor light emitting sections $M_1$ to $M_4$ and conductor layers $L_1$ to $L_4$ electrically led out of the first to fourth electrodes $A_1$ to $A_4$ are formed by way of an interlayer insulation layer 9 on one main surface 21a of the semiconductor substrate 21.

Each of the conductor layers $L_1$ to $L_4$ is formed in a narrow width, in the direction crossing, for example, crossing at a light angle to the direction of the stripe for each of the semiconductor light emitting sections $M_1$ to $M_4$ and extended to the outside from the portion for forming entire semiconductor light emitting sections $M_1$ to $M_4$. For instance, the lateral size for each of the ends is increased to form first to fourth bonding pads $PD_1$ to $PD_4$ to be bonded with not illustrated external leads, for example, gold (Au) lead wires by hot press bonding.

Then, high resistance isolation regions 22 are formed facing the main surface 21a of the semiconductor substrate 21, between each of the semiconductor light emitting sections $M_1$ and $M_2$, between $M_2$ and $M_3$ and between $M_3$ and $M_4$ arranged side by side in plurality and, further, on both outsides of the semiconductor light emitting sections $M_1$ and $M_4$ situated on both sides of the semiconductor light emitting sections arranged in plurality, over the entire longitudinal direction of the stripes for the semiconductor light emitting sections $M_1$ to $M_4$, respectively.

Further, a partitioning high resistor isolation regions 22D are disposed further to the outside of the high resistance isolation regions 22 formed to the outside of the outer semiconductor light emitting sections $M_1$ and $M_4$, for surrounding the bonding pads $PD_1$ to $PD_2$ formed to the conductor layers $L_3$ and $L_4$ of the semiconductor light emitting sections $M_1$ and $M_4$ and partitioning them from each other, particularly, for partitioning adjacent bonding pads from each other.

The high resistance isolation region 22D is formed, for example, into a T-shaped pattern comprising a first portion $22D_A$ extended in parallel with the direction of the stripe and a second portion $22D_B$ in perpendicular thereto, which defines first and second partitioning regions $S_1$ and $S_2$ forming adjacent bonding pads $PD_1$ and $PD_2$, and third and fourth partitioning areas $S_3$ and $S_4$ forming the bonding pads $PD_3$ and $PD_4$ respectively. The defined area surrounds the portion for forming each of the bonding pads by the partitioning high resistor isolation regions 22D and the edge of the semiconductor substrate constituting the multi-semiconductor laser.

Figure 3:
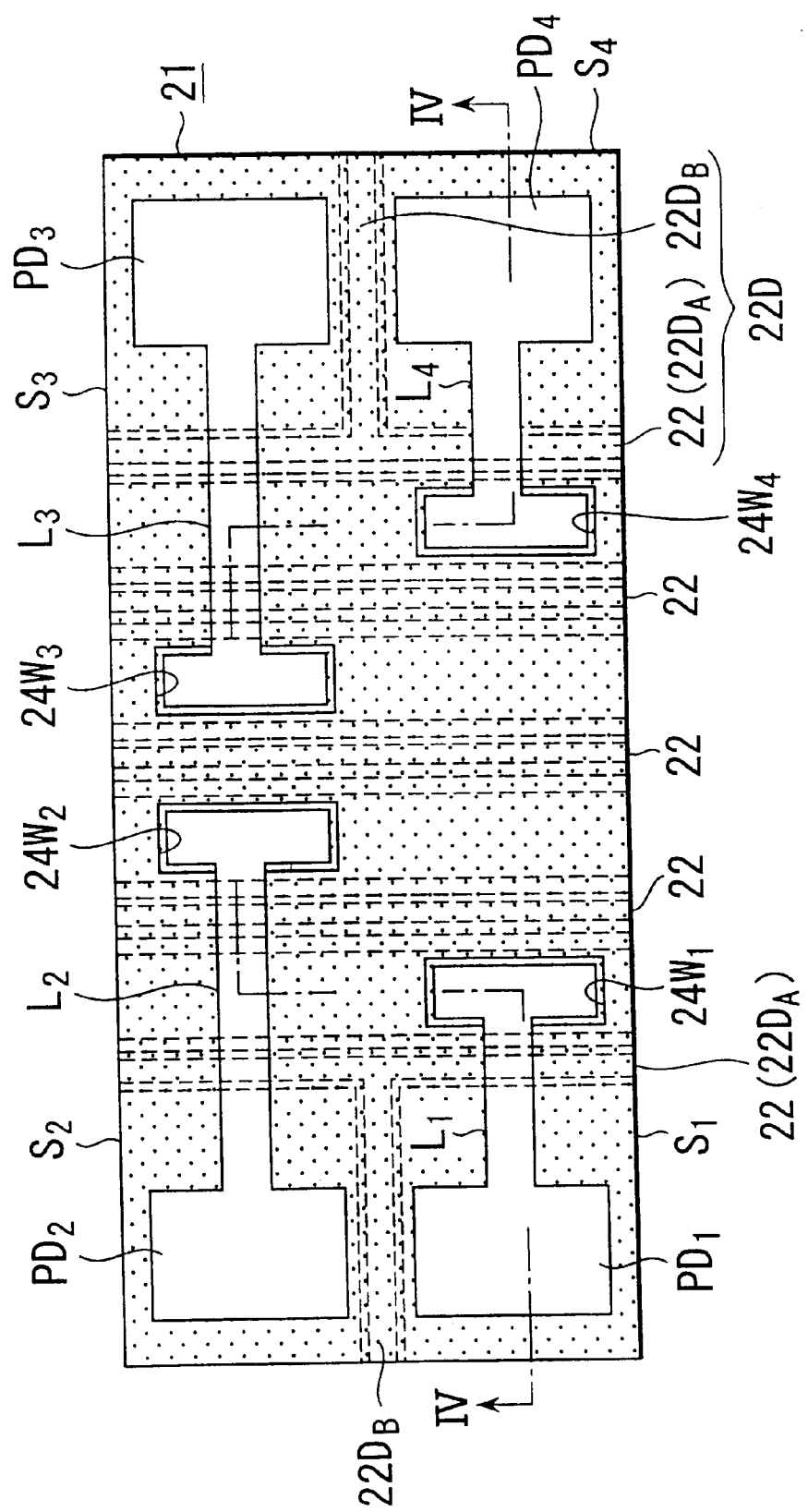
FIG. 3 is a schematic plan view of another embodiment for a semiconductor light emitting device according to the present invention.

In another embodiment of the semiconductor light emitting device according to the present invention, the partitioning high resistor isolation region 22D for partitioning the bonding pads and the high resistance isolation region 22 disposed to the outside of the outer semiconductor light emitting section are integrated. FIG. 3 shows a schematic plan view for one embodiment thereof and FIG. 4 shows a schematic cross sectional view taken along line II—II in FIG. 3. However, the invention is not restricted also in this case only to this embodiment.

In FIG. 3 and FIG. 4, those portions corresponding to those in FIG. 1 and FIG. 2 carry the same reference numerals for which duplicate explanation is to be omitted.

In this embodiment, high resistance isolation regions 22 are disposed to the outside and along the semiconductor light emitting sections $M_1$ and $M_4$ disposed at the outermost sides and they are used also as the first portion $22D_A$ of the partitioning high resistance isolation region 22D in FIG. 1, which is extended therefrom further side way to form the second portion $22D_B$ into a T-shaped pattern.

In this way, they are constituted so as to function both as the high resistance isolation region 22 formed to the outside of the semiconductor light emitting sections $M_1$ and $M_4$ disposed at the outermost side in FIG. 1 and FIG. 2 and the high resistance isolation region 22D for partitioning the bonding pads.

In each of the embodiments and each of the examples described above, the semiconductor light emitting sections ($M_1$ to $M_4$) can be constituted, for example, with semiconductor laser devices.

As shown, for example, in FIG. 2 and FIG. 4, the semiconductor substrate 21 comprises, formed on a substrate 1 of a first conduction type, for example, n-type GaAs, a first clad layer 2 of an identical conduction type, for example, n-type $Al_{0.45}Ga_{0.55}As$, an intrinsic active layer 3, for example, of $Al_{0.14}Ga_{0.86}As$ with a smaller band gap, a second conduction type second clad layer 4, for example, of p-type $Al_{0.45}Ga_{0.55}As$, a first conduction type current block layer 5, for example, of n-type GaAs formed with a stripe-like opening to form a stripe-like current channel, and a second conduction type, for example, p-type GaAs.

Each of the high resistance isolation regions 22 and 22D is formed from the main surface 21a of the semiconductor substrate 21 to a depth traversing the active layer 3.

Each of the high resistance isolation regions 22 and 22D can be constituted such that an isolation groove 23 is formed from the main surface 21a of the semiconductor substrate 21, for example, to such a depth as traversing the active layer 3, an insulation layer 24 such as $SiO_2$ or SiN is formed to the inner surface thereof, and a flattening material 25 made of an insulative resin material having a relatively low dielectric constant is buried into a concave of the isolation groove 23 for making a flat surface which is just in flush with other surfaces.

Further, each of the high resistance isolation regions 22 and 22D can also be constituted as region increased with the resistivity due to crystal damages caused by ion injection although not illustrated.

Method of Manufacturing a Semiconductor Light Emitting Device

A method of manufacturing a semiconductor light emitting device according to the present invention described above is to be explained. The structure of the semiconductor light emitting device according to the present invention is made more clear by the description for the manufacturing method.

A method of manufacturing a semiconductor light emitting device according to the present invention shown in FIG. 1 and FIG. 2 is to be explained with reference to FIG. 5 through FIG. 8. In FIG. 5 through FIG. 8, each of the figures A is a schematic plan view for a main portion in each of the steps and each of figures B is a schematic cross sectional view taken along line B—B in each of the figures A.

Figure 5A:
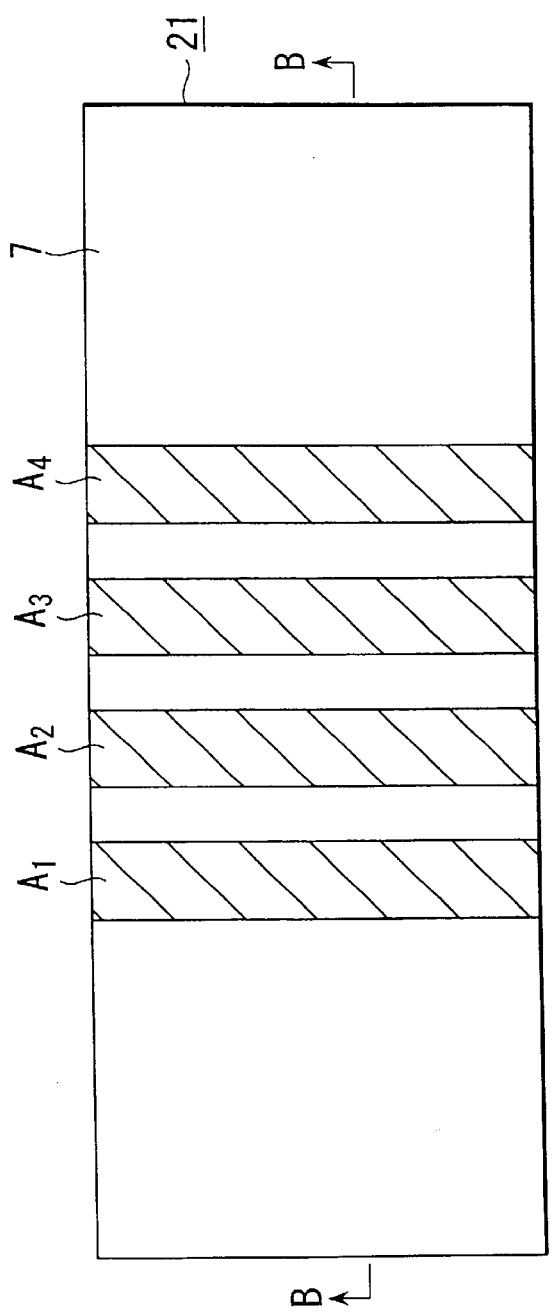
FIG. 5A and FIG. 5B are a schematic plan view for one manufacturing step in one embodiment for a semiconductor light emitting device according to the present invention and a schematic cross sectional taken along line B—B thereof.
Figure 5B:
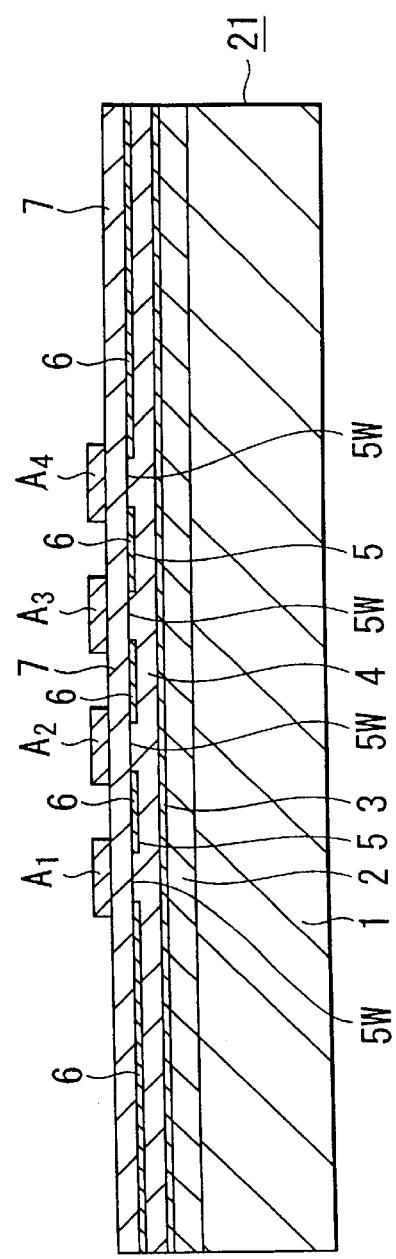

As shown in FIG. 5A and FIG. 5B, a semiconductor substrate 21 is constituted and first to fourth electrodes Al to $A_4$ are deposited on one main surface 21a thereof.

The semiconductor substrate 21 and the electrodes $A_1$ to $A_4$ can be formed by the same procedures as those explained for FIG. 11A through FIG. 10C, and FIG. 1A and FIG. 1B. On a semiconductor substrate 1 comprising, for example, of n-type GaAs, there are epitaxially grown a first clad layer 2 comprising, for example, n-type $Al_{0.45}Ga_{0.55}As$, an intrinsic active layer 3 comprising, for example, of non-doped $Al_{0.14}Ga_{0.86}As$ and a second clad layer 4 comprising p-type $Al_{0.45}Ga_{0.55}As$ successively by an MOCVD (Metal Organic Chemical Vapor Deposition) method.

Then, current block layers 5 each having a stripe-shaped opening 5W in parallel with each other on the second clad layer 4 are formed to the portions for forming the semiconductor emitting sections respectively.

Figure 10A:
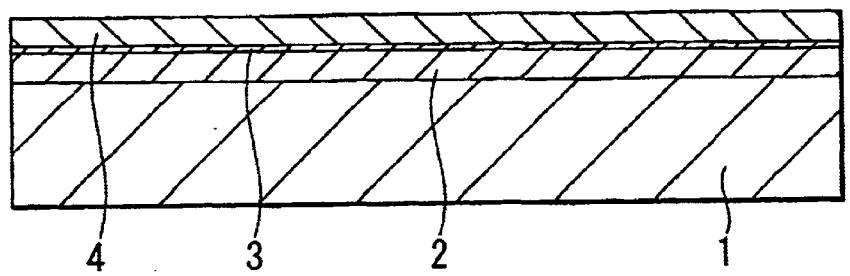
FIG. 10A to FIG. 10C are schematic cross sectional views in each of steps for an existent method of manufacturing a semiconductor light emitting device.
Figure 10B:
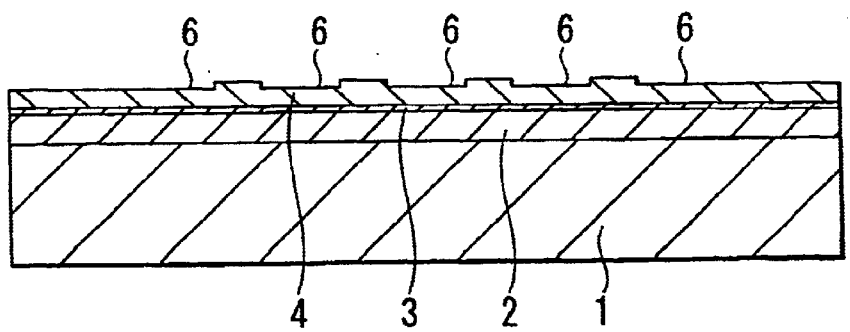
Figure 10C:
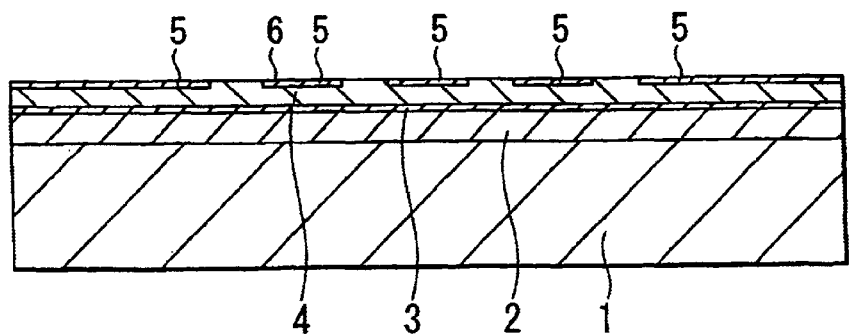

Upon forming the current block layers 5, as explained with reference to FIG. 10B, grooves 6 are formed respectively, for example, by RIE (Reactive Ion Etching) to portions for selectively forming the current block layers 5 in a stripe patterns, that is, between the portions for forming each of the semiconductor light emitting sections and to the outside of the portions for forming the semiconductor light emitting sections formed to the outermost side, for example, over the entire area in this embodiment. Subsequently, an n-type GaAs semiconductor layer having a conduction type different from that of the second clad layer 4 is epitaxially grown entirely so as to bury the inside of the grooves 6 and etching is applied entirely from the surface to form the current block layer 5 while leaving the n-type GaAs semiconductor layer only in the grooves 6.

Figure 11A:
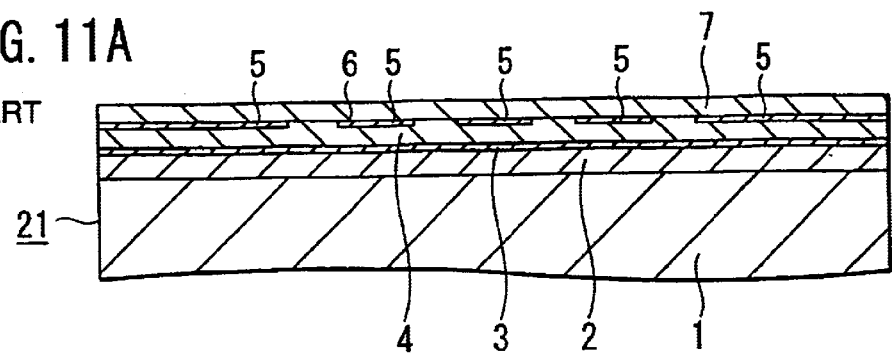
FIG. 11A to FIG. 11C are schematic cross sectional views in each of steps for an existent method of manufacturing a semiconductor light emitting device.
Figure 11B:
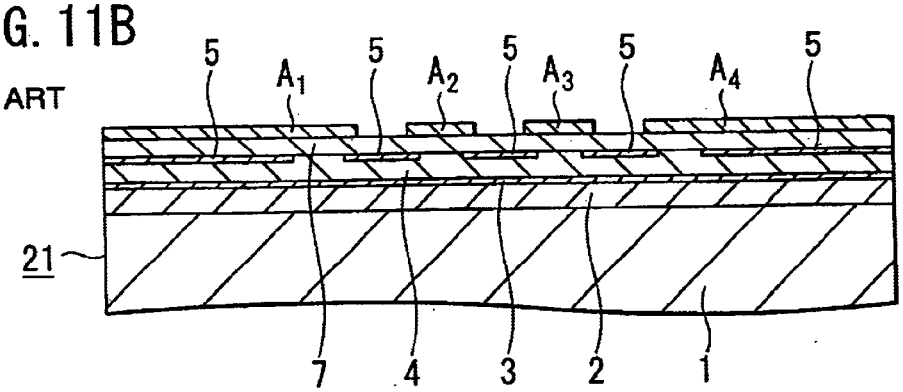
Figure 11C:
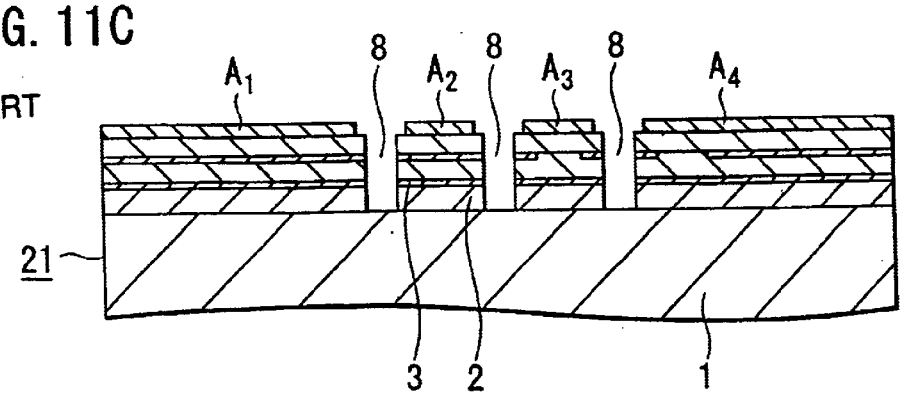
Figure 12A:
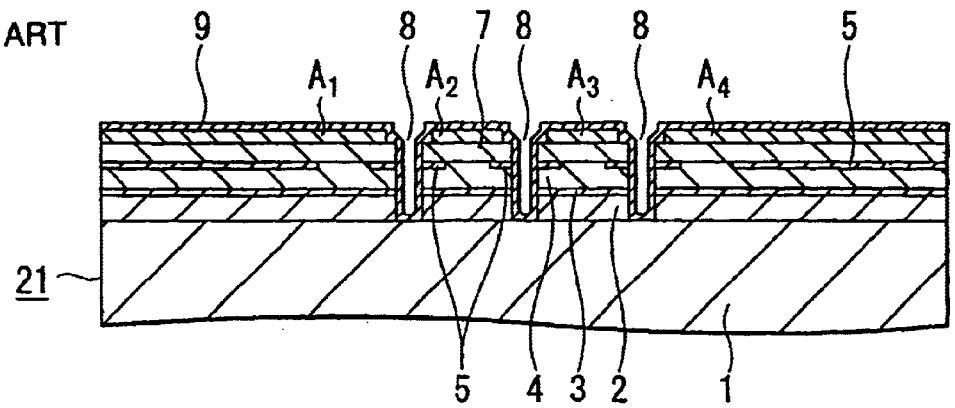
FIG. 12A to FIG. 12C are schematic cross sectional views in each of steps for an existent method of manufacturing a semiconductor light emitting device.
Figure 12B:
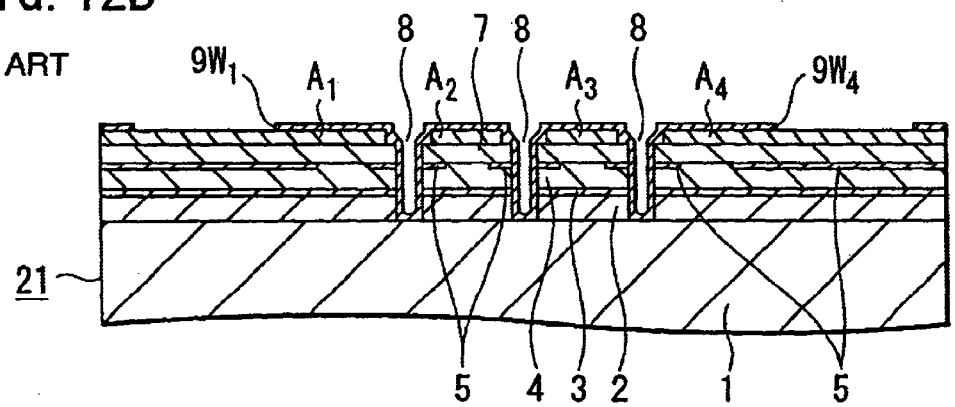
Figure 12C:
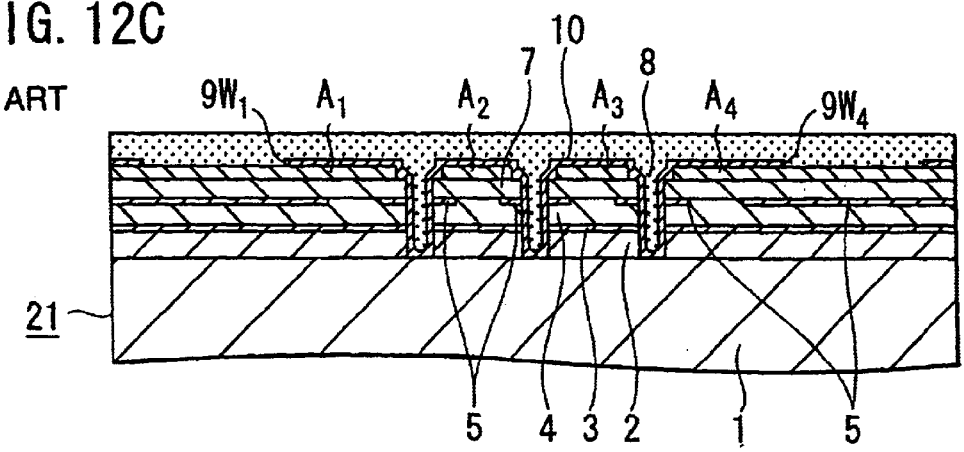
Figure 13:
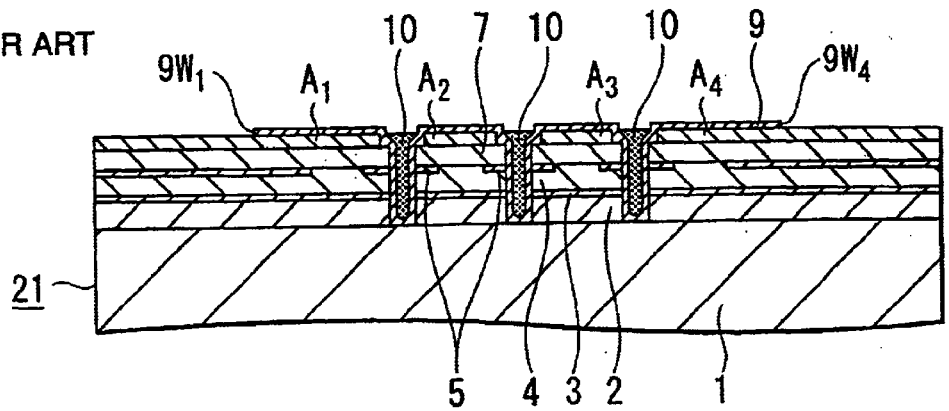
FIG. 13 is a schematic cross sectional view in one step of existent method of manufacturing a semiconductor light emitting device.
Figure 14:
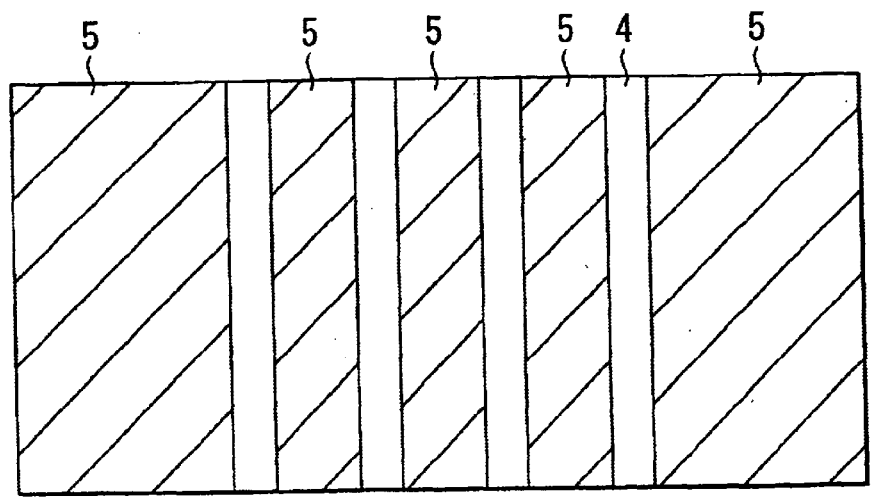
FIG. 14 is a schematic plan view of FIG. 10C.
Figure 15:
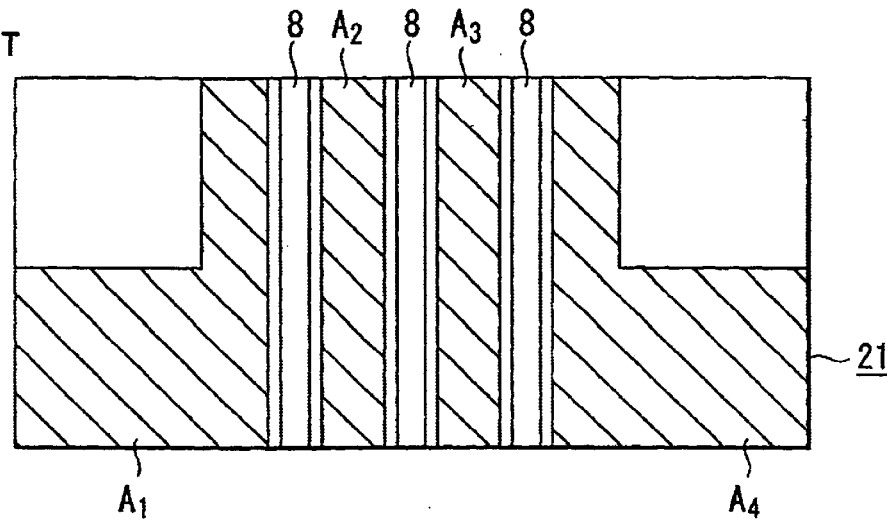
FIG. 15 is a schematic plan view of FIG. 11C.
Figure 16:
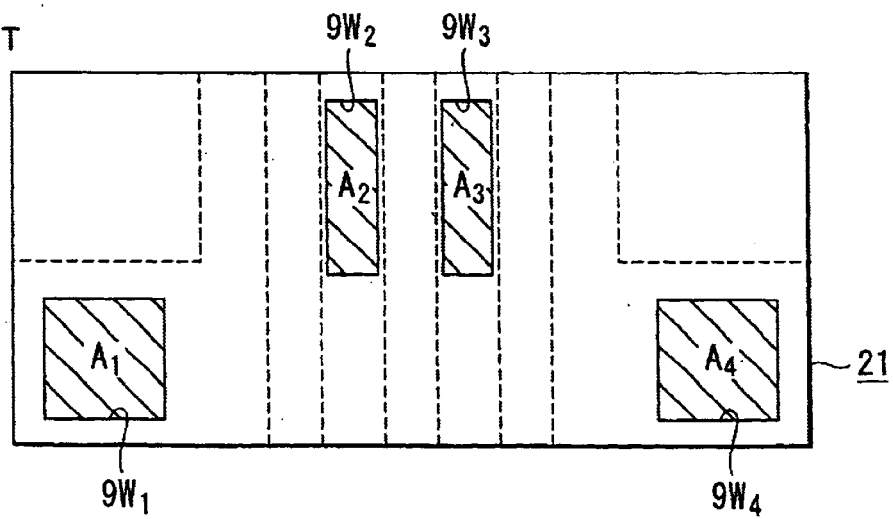
FIG. 16 is a schematic plan view of FIG. 12B.
Figure 17:
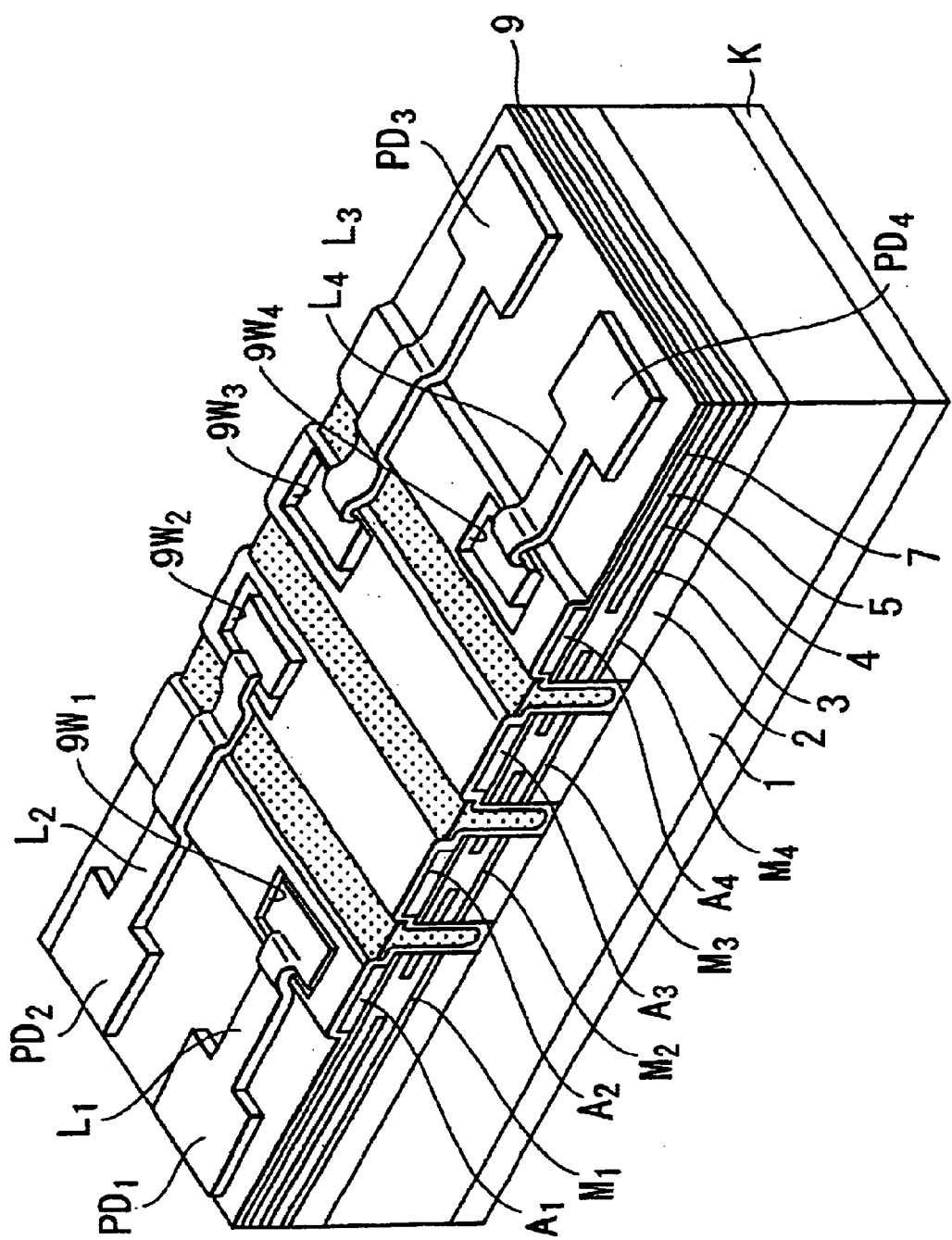
FIG. 17 is a schematic perspective view a semiconductor light emitting device.

Further, as explained with reference to FIG. 11A, a cap layer 7 comprising p-type GaAs is epitaxially grown covering the current block layers 5, for example, by MOCVD.

The semiconductor substrate 21 is constituted in this way.

The active layer 3 is formed to the semiconductor substrate 21 at such a level that the depth from the main surface 21a of the semiconductor substrate 21 formed with the surface of the cap layer 7 is about 1.5 to 2.5 $\mu$m and the thickness of the active layer can be made, for example, to about 0.1 $\mu$m.

Then, corresponding to the stripe-shaped openings 5W of the current block layers 5, stripe-shaped first to fourth electrodes $A_1$ to $A_4$ are deposited in parallel in ohmic contact, respectively, along the openings 5W on the cap layer 7 facing the main surface 21a of the semiconductor substrate 21 as shown in FIG. 5.

Figure 6A:
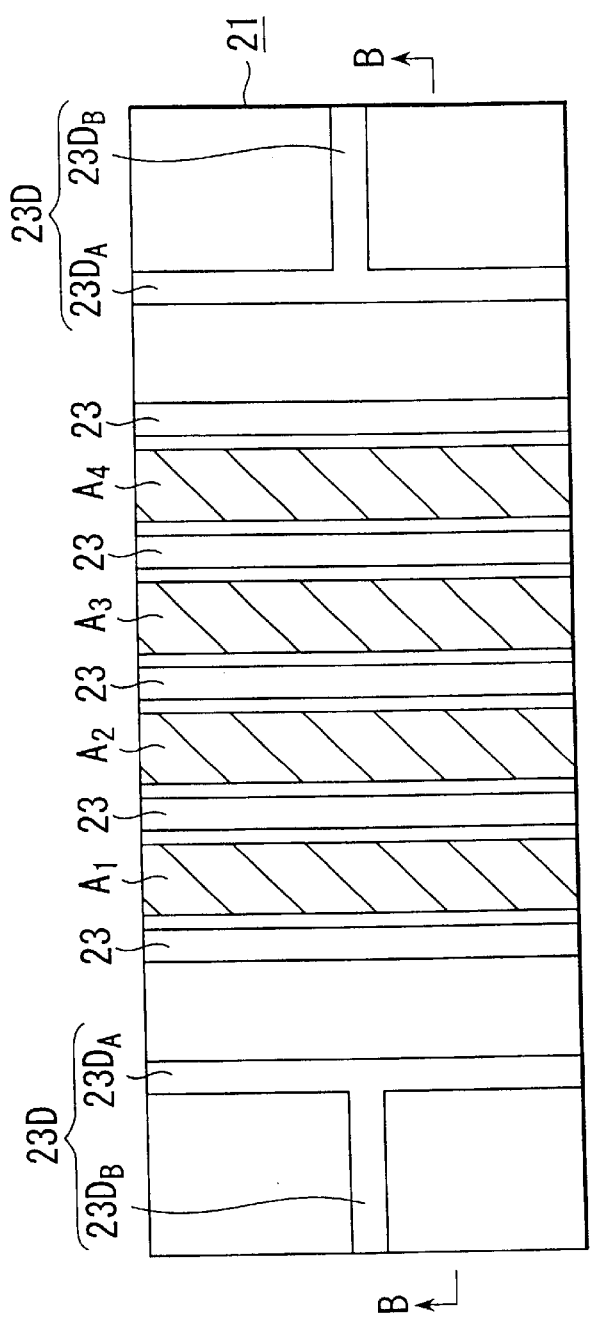
FIG. 6A and FIG. 6B are a schematic plan view in one manufacturing step of one embodiment for a semiconductor light emitting device according to the present invention and a schematic cross sectional view taken along line B—B thereof.
Figure 6B:
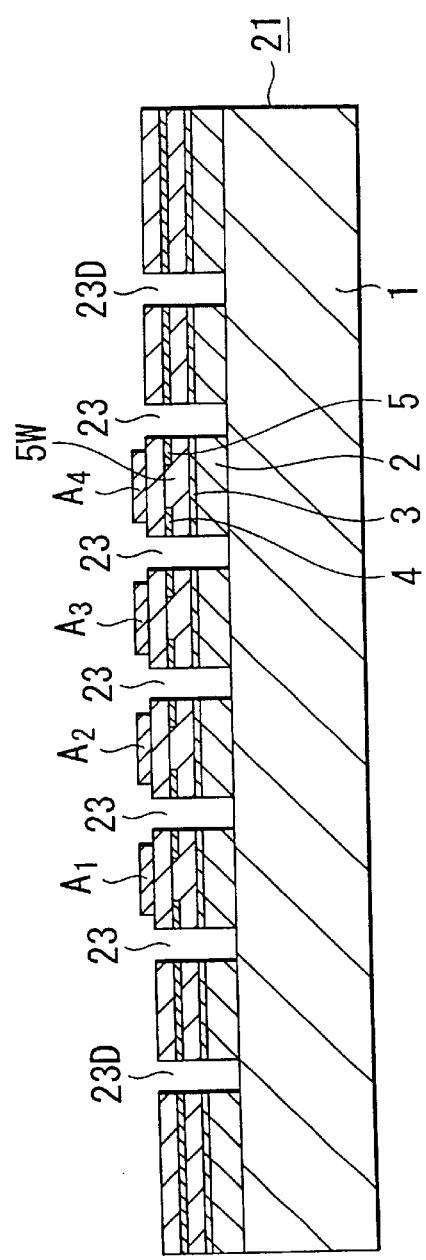

Then, as shown in FIGS. 6A and 6B, an isolation groove 23 is formed between each of the electrodes $A_1$ to $A_4$ and to the outside of the electrodes $A_1$ and $A_4$ on both outer sides in parallel with the electrodes $A_1$ to $A_4$, and a partitioning isolation groove 23D in a T-shaped pattern is formed further to the outside thereof. Each of the isolation grooves 23D comprises a first part $23D_A$ in parallel with the stripe-like isolation groove 23 and a part section $23D_B$ in perpendicular thereto, and the T-shaped isolation grooves 23D define two partitioned areas $S_1$ and $S_2$, and $S_3$ and $S_4$ respectively.

The isolation grooves 23 and 23D can be formed, for example, by RIE. Further, the depth of the isolation grooves 23 and 23D is made to such a depth as traversing the active layer 3, for example, of about 3.5 to 5.0 $\mu$m, and the width for the isolation grooves 23 and 23D is selected, for example, as about from 2 to 5 $\mu$m so as to provide an aspect ratio as capable of preferably forming the insulation layer and filling the flattening material to the inner surface of the isolation groove to be described later.

Figure 7A:
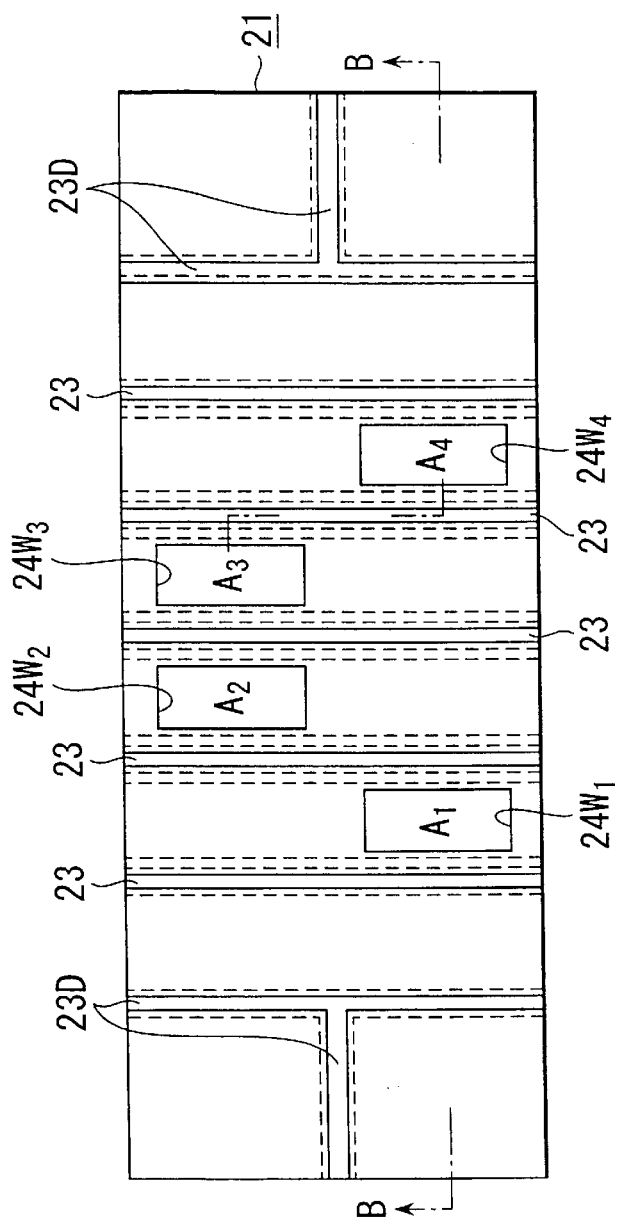
FIG. 7A and FIG. 7B are a schematic plan view in one manufacturing step of one embodiment for a semiconductor light emitting device according to the present invention and a schematic cross sectional view taken along line B—B thereof.
Figure 7B:
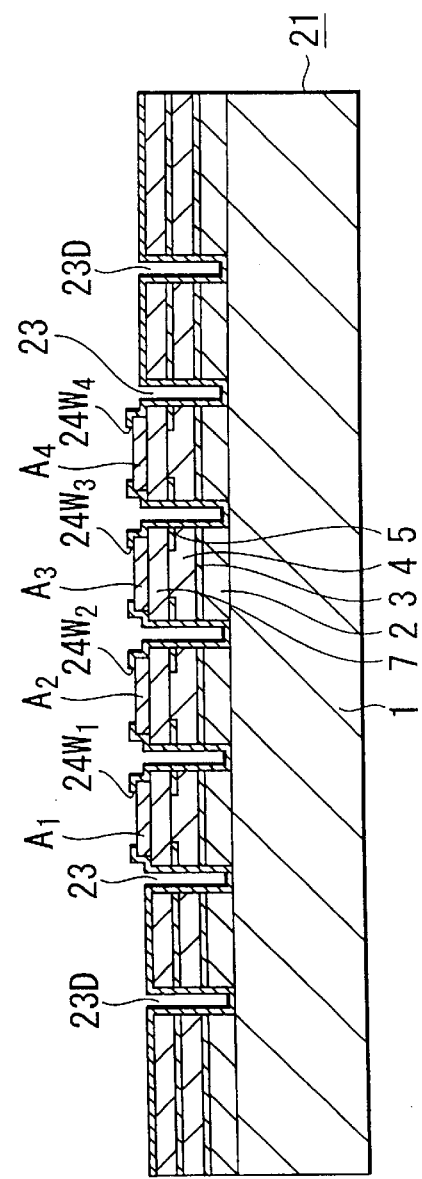
Figure 9:
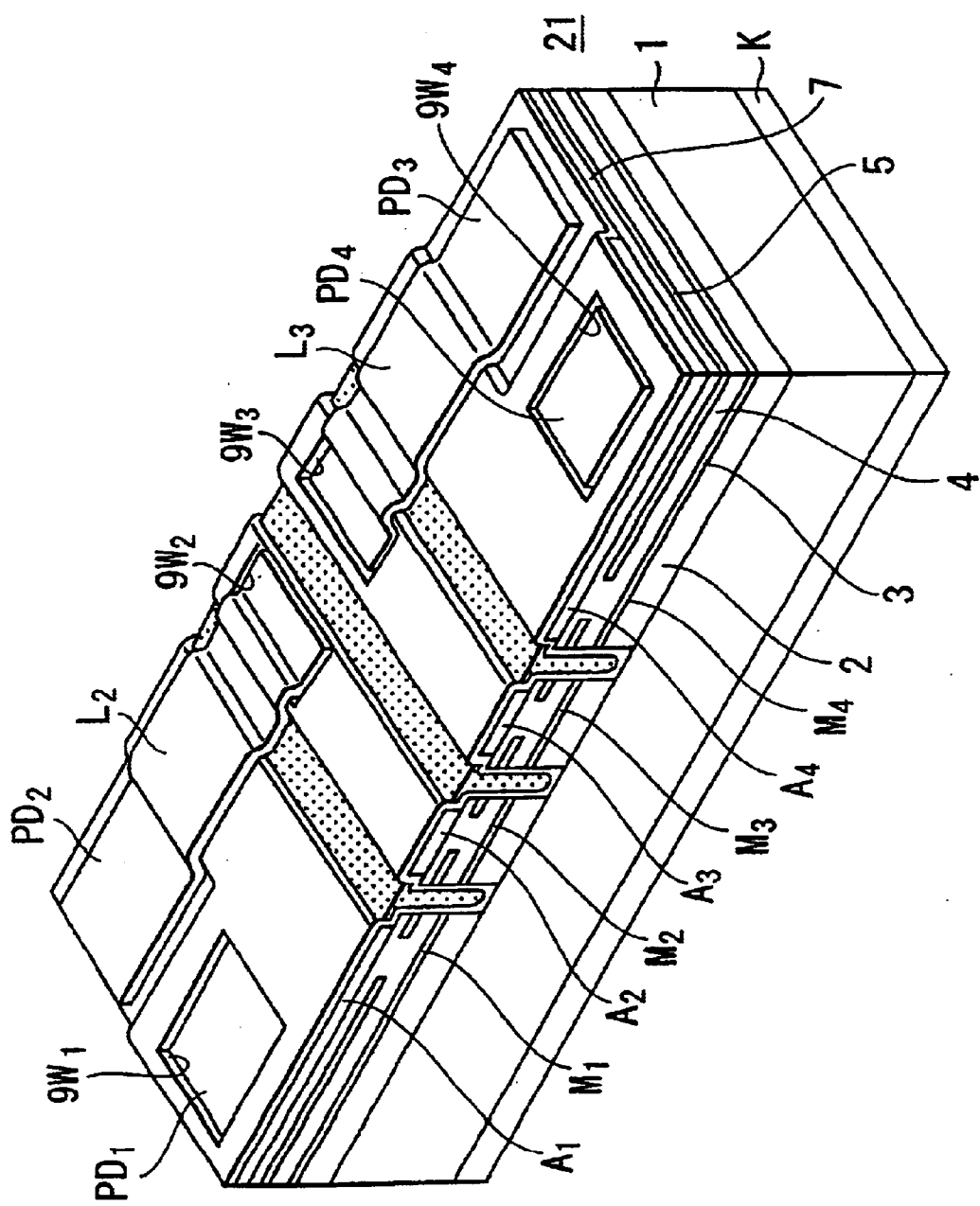
FIG. 9 is a schematic perspective view of a n existent semiconductor light emitting device.

Then, as shown in FIG. 7A and FIG. 7B, an insulation layer 24 such as made of SiN or $SiO_2$ is formed entirely to a thickness, for example, of about 300 nm once by a method capable of depositing the same to the inner surface of each of the isolation grooves 23 and 23D with good coverage such as CVD (Chemical Vapor Deposition) method or sputtering. Subsequently, first to fourth openings $24W_1$ to $24W_4$ are apertured by a well-known pattern etching on each of the stripe-like shape electrodes $A_1$ to $A_4$ respectively.

In this case, the openings $24W_1$ to $24W_4$ are preferably positioned corresponding respectively to partition areas $S_1$ to $S_4$.

Then, as shown in FIGS. 8A and 8B, a flattening material 25 with low dielectric constant and having insulative property is formed so as to bury the inside of each of the isolation grooves 23 and 23D. The flattening material 25 is formed by once forming a polyimide resin or the like entirely by rotational coating to such a thickness as flattening the surface, subsequently, re-opening each of the first to fourth openings $24W_1$ to $24W_4$, for example, by mechano-chemical polishing, and etching back the flattening material 25 from the surface in a plane manner to a position where each of the first to fourth electrodes $A_1$ to $A_4$ are exposed to the outside through the openings $24W_1$ to $24W_4$.

In this constitution, an interlayer insulation layer 9 is constituted with the insulation layer 24 and the flattening material 25.

Then, as shown in FIG. 1 and FIG. 2, conductor layers $L_1$ to $L_4$ in ohmic contact respectively with the first to fourth electrodes $A_1$ to $A_4$ through each of the first to fourth openings $24W_1$ to $24W_4$ are extended on each of the first to fourth partitioned areas $S_1$ to $S_4$ overriding the interlayer insulation layer 9 comprising the insulation layer 24 and the flattening material 25. The width of each of the conductor layers $L_1$ to $L_4$ is enlarged in the extended portion on each of the first to fourth partitioned areas $S_1$ to $S_4$ to form first to fourth bonding pads $PD_1$ to $PD_4$ respectively.

Further, a common counter electrode, a cathode electrode K in this embodiment, is deposited in ohmic contact, for example, entirely to the rear face of the semiconductor substrate 1.

Then, the end face for each of the stripe portions for each of the semiconductor emitting sections $M_1$ to $M_4$ is made as a mirror surface by constituting the same with cleavage surface.

The semiconductor light emitting device explained with reference to FIG. 1 and FIG. 2 is constituted by the method described above. In this constitution, when predetermined voltage is applied between each of the anode electrodes $A_1$ to $A_4$ and the common cathode electrode K, a current is charged restrictively to the active layer 3 below a stripe portion put between the current block layers 5 between the electrodes $A_1$ to $A_4$ and K, to constitute to semiconductor light emitting sections $M_1$ to $M_4$ comprising light resonators with the longitudinal direction of the stripe being as the longitudinal direction of the resonator, that is, semiconductor laser devices in this embodiment respectively, and laser light is emitted forwardly and backwardly from both end faces of each of the light resonators.

Then, since the laser devices, that is, the semiconductor light emitting sections $M_1$ to $M_4$ are electrically isolated from each other by the high resistance isolation regions 22 comprising the insulation layer 22 and the flattening material 25 formed in the isolation grooves 23 and the respective anode electrodes $A_1$ to $A_4$ are independently constituted electrically, each of the devices can be driven independently of each other.

Then, in the semiconductor light emitting device of this structure, the high resistance isolation region 22 is disposed with respect to each of the semiconductor light emitting sections $M_1$ to $M_2$, that is, not only between each of the semiconductor light emitting sections but also to the outside of the semiconductor light emitting sections $M_1$ and $M_4$ disposed to both outsides to isolate the semiconductor light emitting sections electrically from each other, and the high resistance isolation region 22 can be constituted to have a low dielectric constant, so that it is possible to reduce the parasitic capacitance formed not only between each of the semiconductor light emitting sections but also relative to the conductor layers $L_3$ and $L_4$ for other semiconductor light emitting sections and, particularly, between the bonding pads and, accordingly, cross-talk occurring between the semiconductor light emitting sections caused by the parasitic capacitance can be decreased.

Further, in the semiconductor light emitting sections $M_1$ and $M_4$ on both outsides, since the active layer extending to the outside thereof is isolated, the junction capacitance of the active layer extended to the outside thereof can be eliminated.

Further, as described above, since the conductor layers between the bonding pads disposed being adjacent with each other are partitioned by the partitioning high resistor isolation region 22D, even if the interlayer insulation layer 9 is fractured, for example, upon bonding of an external lead to the bonding pad, it is possible to avoid short-circuit accident between semiconductor light emitting sections to each other.

Further, in the method of manufacturing the semiconductor light emitting device according to the present invention, the high resistance isolation region 22 and the partitioning high resistance isolation region 22D are formed also to the outside of the semiconductor light emitting sections situated on both outsides of a plurality of semiconductor light emitting sections but, since the high resistance isolation regions can be formed simultaneously with the isolation regions for isolating adjacent light emitting sections from each other, increase for the number of steps can be avoided.

For the manufacturing method according to the present invention described above, explanation has been made to a case of obtaining the structure shown in FIG. 1 and FIG. 2, but the semiconductor light emitting device with the constitution shown in FIG. 3 and FIG. 4 can also be manufactured by the same procedures as those in FIG. 5 to FIG. 8 described previously, excepting that the high resistance isolation regions at the outside of the high resistance isolation regions 22 disposed to the outside of the semiconductor light emitting sections is formed into a pattern integrated with the high resistance isolation region 22D for partitioning the bonding pads from each other.

Further, the high resistance isolation regions such as the high resistance isolation 22 or the partitioning high resistance isolation region 22D described above can also be formed by damaging crystals entirely or partially by ion implantation to increase the resistance.

While explanations have been made for each of examples described previously with respect to one multi-beam semiconductor light emitting device, a plurality of semiconductor light emitting devices can be manufactured simultaneously in actual production, by forming a plurality of multi-semiconductor light emitting devices to a single sheet of the semiconductor substrate 21 and then isolating them into each of multi-beam semiconductor light emitting devices.

In each of the examples described above, four semiconductor light emitting sections $M_1$ to $M_4$ are arranged and formed T-shaped patterns for partitioned areas $S_1$ to $S_4$ by paired partitioning high resistance isolation regions 22D, but it may be constituted such that an optional number of semiconductor light emitting sections are arranged, in which the partitioning high resistance isolation region 22D can be formed into a pattern of various shapes for partitioning so as to surround each of the bonding pads.

While the embodiment describes above show the semiconductor light emitting section as the semiconductor laser device but it may be constituted with a semiconductor light emitting diode device.

Further, the embodiment described above is constituted with AlGaAs series III–V group semiconductor but it may be constituted with various other III–V group semiconductors such as AlGaInAs or AlGaInP, or with II–VI group semiconductors such as ZnMgSSe series, or a so-called SCH (Separate Confinement Hetero structure) in which a guide layer is disposed in adjacent with the active layer.

In the semiconductor light emitting device according to the present invention, as described above, since the portion between each of the light emitting sections and the portion between the light emitting section and the conductor layer as the lead portion is isolated by the high resistance isolation regions, that is, a low dielectric constant region, capacitance caused by the extended portion on both outsides of the active layer regarding the semiconductor light emitting sections on both outsides can be reduced and cross-talk between them can be avoided effectively and response can be improved, also in a case where the density for the integration degree of the semiconductor light emitting sections is increased in the semiconductor light emitting device.

Then, by the improvement for the cross-talk, it is possible, in a case where one of adjacent light emitting sections is put to a continuous oscillation driving, while another light emitting section is driven intermittently as described in the preceding part of this text to avoid interference between each other, such as generation of large spike noises to the output of the laser device put to continuous oscillation driving, and stable operation can be conducted.

Further, since the light emitting section and the conductor layer forming the lead portion are separated from each other by the high resistance isolation region, occurrence of short-circuit accident can be avoided upon assembling operation for the semiconductor light emitting device, for example, in a bonding operation for lead wires such as gold wires by hot press bonding to the bonding pad of the conductor layer of lead portions led out of the electrode of the semiconductor light emitting section even in a case where the interlayer insulation layer below the bonding pad is damaged Accordingly, it is possible to improve the yield and enhance the reliability.

Further, while the method of manufacturing the semiconductor light emitting device according to the present invention is adapted for obtaining a semiconductor light emitting device of a structure in which not only the semiconductor light emitting sections are isolated from each other but also they are isolated from the portions, the high resistance isolation region for conducting isolation from other portions can be conducted simultaneously with the existent isolation operation, so that it does not increase the number of steps and can avoid disadvantages such as lowering of the productivity and increase of the manufacturing cost.

What is claimed is:

1. A method of manufacturing a semiconductor light emitting device comprising the steps of:

forming a plurality of light emitting sections in side-by-side relationship on a semiconductor substrate;

forming a respective electrode for each of the semiconductor light emitting sections on a main surface of the semiconductor substrate;

forming a respective layer substantially along the main surface and that is electrically coupled to the electrode;

forming a high resistance isolation region extending between neighboring semiconductor light emitting sections and extending between adjacent conductor layers, the high resistance isolation region having a surface facing the main surface of the substrate and surfaces facing the neighboring semiconductor light emitting sections; and forming a high resistance isolation region to isolate two neighboring light emitting sections from each other and to surround bonding pads to which said conductor layers are coupled.

2. A method of manufacturing a semiconductor light emitting device as claimed in claim 1, wherein the semiconductor light emitting section is a semiconductor laser device.

3. A method of manufacturing a semiconductor light emitting device as claimed in claim 1, wherein the semiconductor layer comprises at least a first cladding layer, an active layer and a second cladding layer, and the high resistance isolation region is formed to a depth so as to traverse the active layer.

4. A method of manufacturing a semiconductor light emitting device as claimed in claim 1, wherein the step of forming the high resistance isolation region comprises a step of forming an isolation groove in the semiconductor substrate.

5. A method of manufacturing a semiconductor light emitting device as claimed in claim 1, wherein the step of forming the high resistance isolation region comprises a step of forming an isolation groove in the semiconductor substrate, and a step of filling the isolation groove with a material.

6. A method of manufacturing a semiconductor light emitting device as claimed in claim 1, wherein the step of forming the high resistance isolation region comprises an ion implanting step.

7. A method of manufacturing a semiconductor light emitting device as claimed in claim 1, wherein an a high resistance isolation region is formed between each pair neighboring light emitting sections.

8. A method of manufacturing a semiconductor light emitting device as claimed in claim 1, wherein an electrode and conductor layer pair is formed for each light emitting section with the conductor layer is formed to extend in a direction substantially orthogonal to a direction in which the electrode extends.

* * * * *